(12) United States Patent
Kim

(10) Patent No.: US 11,143,711 B2
(45) Date of Patent: Oct. 12, 2021

(54) APPARATUS AND METHOD FOR DETECTING WIRING SHORT IN SUBSTRATE

(71) Applicant: SAMSUNG ELECTRO-MECHANICS CO., LTD., Suwon-si (KR)

(72) Inventor: Tai Jin Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 233 days.

(21) Appl. No.: 16/676,347

(22) Filed: Nov. 6, 2019

(65) Prior Publication Data

US 2020/0225272 A1 Jul. 16, 2020

(30) Foreign Application Priority Data

Jan. 16, 2019 (KR) .................. 10-2019-0005670

(51) Int. Cl.
*G01R 31/50* (2020.01)
*G01R 31/26* (2020.01)
(Continued)

(52) U.S. Cl.
CPC ......... *G01R 31/50* (2020.01); *G01R 19/0023* (2013.01); *G01R 31/26* (2013.01);
(Continued)

(58) Field of Classification Search
CPC ........ G01R 31/00; G01R 31/26; G01R 31/28; G01R 31/2801; G01R 31/2805;
(Continued)

(56) References Cited

U.S. PATENT DOCUMENTS

| 6,940,289 B2 * | 9/2005 | Hyacinthe | ............... G01R 27/16 |
| | | | 324/534 |
| 7,076,374 B2 * | 7/2006 | Rogovin | ................ G01R 31/58 |
| | | | 702/59 |

(Continued)

FOREIGN PATENT DOCUMENTS

| JP | 2005-241614 A | 9/2005 |
| JP | 2015-114195 A | 6/2015 |

(Continued)

*Primary Examiner* — Hoai-An D. Nguyen
(74) *Attorney, Agent, or Firm* — Morgan, Lewis & Bockius LLP

(57) ABSTRACT

An apparatus for detecting a wiring short in a substrate includes a voltage source configured to apply a rising or falling measurement voltage to a first wiring of a substrate, a plurality of electrodes including first and second electrode elements capacitively coupled to the first and second wirings of the substrate, respectively, a sensing circuit configured to generate an output voltage based on a voltage or a current between the first and second electrode elements, and a processor configured to determine whether a short circuit connection having a resistance value greater than a reference resistance value is present between the first and second wirings based on a change rate of the output voltage after application of the measurement voltage. Methods for detecting wiring shorts in the substrate are further provided.

18 Claims, 15 Drawing Sheets

(51) Int. Cl.
*G01R 31/28* (2006.01)
*G01R 31/30* (2006.01)
*G01R 31/317* (2006.01)
*G01R 19/00* (2006.01)
*H05K 1/11* (2006.01)
*H01L 21/66* (2006.01)

(52) U.S. Cl.
CPC ..... *G01R 31/2805* (2013.01); *G01R 31/2812* (2013.01); *G01R 31/3004* (2013.01); *G01R 31/317* (2013.01); *H01L 22/30* (2013.01); *H05K 1/11* (2013.01)

(58) Field of Classification Search
CPC .............. G01R 31/281; G01R 31/2812; G01R 31/2851; G01R 31/2853; G01R 31/2884; G01R 31/2896; G01R 31/30; G01R 31/3004; G01R 31/302; G01R 31/312; G01R 31/317; G01R 31/50; G01R 31/52; G01R 19/00; G01R 19/0023; H05K 1/00; H05K 1/02; H05K 1/0266; H05K 1/0268; H05K 1/11; H05K 2201/0154; H05K 2201/09781; H01L 22/00; H01L 22/10; H01L 22/14
USPC ....... 324/500, 503, 509, 512, 527, 528, 531, 324/537, 539, 541, 543, 544, 555, 557, 324/600, 649, 691, 713, 715, 718; 340/500, 540, 635, 650
See application file for complete search history.

(56) References Cited

U.S. PATENT DOCUMENTS

| | | | | |
|---|---|---|---|---|
| 7,095,221 | B2* | 8/2006 | Bosselmann | G01S 13/50 324/71.1 |
| 7,129,719 | B2* | 10/2006 | Jung | G01R 31/2853 324/718 |
| 7,141,990 | B2* | 11/2006 | Bast | G01N 3/066 324/708 |
| 7,250,776 | B2* | 7/2007 | Twerdochlib | G01B 7/18 324/693 |
| 7,554,345 | B2* | 6/2009 | Vokey | G01M 3/16 324/522 |
| 7,701,231 | B2* | 4/2010 | Yonushonis | B01D 46/0086 324/718 |
| 10,916,378 | B2* | 2/2021 | Komiyama | H01G 5/011 |
| 10,962,580 | B2* | 3/2021 | Essawy | G01P 5/165 |
| 2003/0199111 | A1* | 10/2003 | Hamamura | G01R 31/2818 438/17 |
| 2004/0095247 | A1* | 5/2004 | De Haan | A61F 13/42 340/573.5 |
| 2013/0149464 | A1* | 6/2013 | Rokuhara | H05K 3/02 427/554 |
| 2017/0147123 | A1* | 5/2017 | Wang | G06F 3/0443 |
| 2017/0199619 | A1* | 7/2017 | Lee | G06F 3/0412 |

FOREIGN PATENT DOCUMENTS

| | | |
|---|---|---|
| KR | 10-2010-0067618 A | 6/2010 |
| KR | 10-2017-0108186 A | 9/2017 |

* cited by examiner

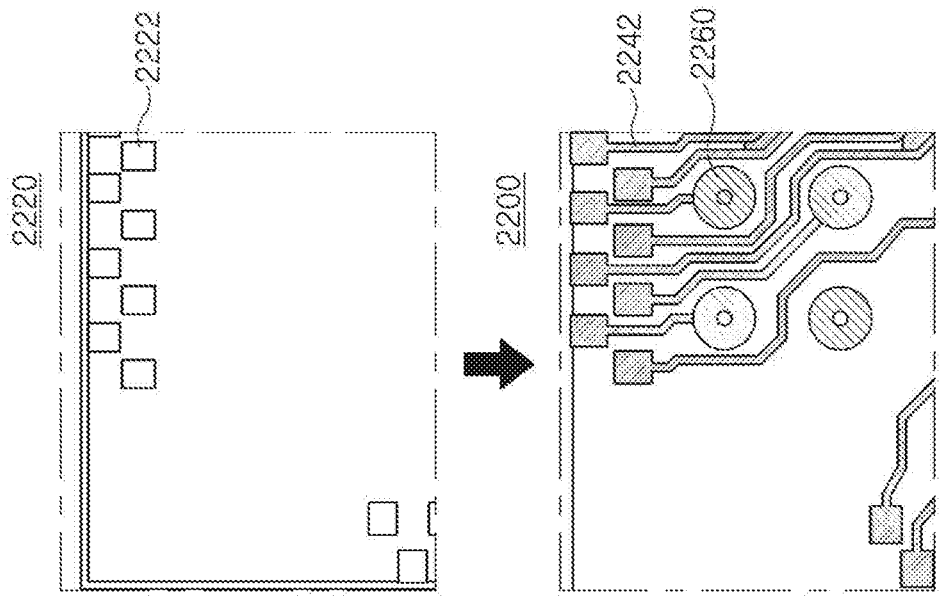
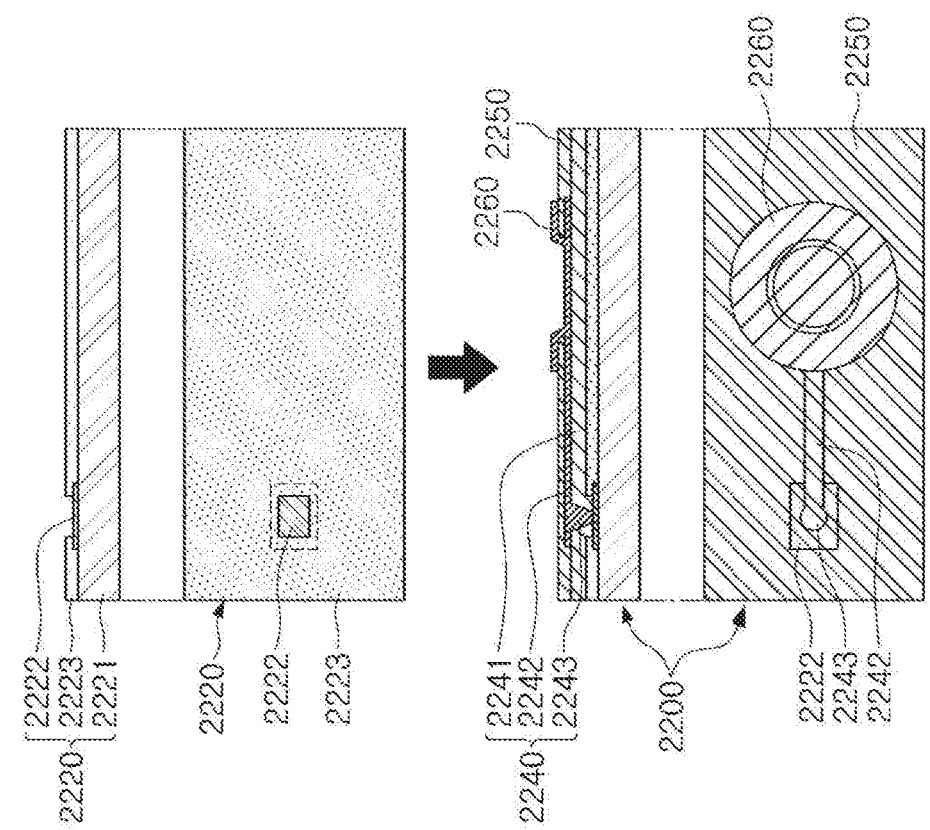
FIG. 10A
FIG. 10B

APPARATUS AND METHOD FOR DETECTING WIRING SHORT IN SUBSTRATE

CROSS-REFERENCE TO RELATED APPLICATION(S)

This application claims the benefit under 35 USC 119(a) of Korean Patent Application No. 10-2019-0005670 filed on Jan. 16, 2019 in the Korean Intellectual Property Office, the entire disclosure of which is incorporated herein by reference for all purposes.

BACKGROUND

1. Field

The present disclosure relates to an apparatus and a method for detecting a wiring short in a substrate.

2. Description of Related Art

In general, a substrate may include a plurality of wirings and may be implemented as a printed circuit board (PCB) or a semiconductor package. Since a short between the plurality of wirings causes an electrical connection relationship of the substrate to significantly deviate from a design, failure of a product containing a substrate may occur.

In the related art, a short between a plurality of wirings is detected by a contact method of bringing a measuring device into contact with a wiring.

However, substrates have been thinned and wiring has become finer in recent years. Therefore, according to a contact detection method, it may be difficult to bring a measuring device into contact with a wiring and secondary failures may result from scratches of a pin during a measuring process.

SUMMARY

Detection accuracy of a short between a plurality of wirings may be affected by a short resistance value and may be lowered as the short resistance value is increased.

An aspect of the present disclosure is to provide an apparatus and a method for detecting a wiring short in a substrate, which are capable of easily detecting a short having a relatively high resistance value.

According to an aspect of the present disclosure, an apparatus for detecting a wiring short in a substrate includes a voltage source configured to apply a rising or falling measurement voltage to a first wiring of a substrate, a plurality of electrodes including a first electrode element capacitively coupled to the first wiring and a second electrode element capacitively coupled to a second wiring of the substrate, a sensing circuit configured to generate an output voltage based on a voltage or a current between the first electrode element and the second electrode element, and a processor configured to determine whether a short circuit connection having a resistance value greater than a reference resistance value is present between the first wiring and the second wiring based on a change rate of the output voltage after application of the measurement voltage.

According to another aspect of the present disclosure, a method for detecting a wiring short in a substrate includes capacitively coupling a plurality of electrodes to a first wiring and a second wiring of a substrate, applying a measurement voltage to the first wiring of the substrate, and determining whether a short circuit connection having a resistance value greater than a reference resistance value is present between the first wiring and the second wiring, based on a difference between a first time constant of an output signal at the first wiring and a second time constant of an output signal at the second wiring responsive to applying the measurement voltage. In one example, the first time constant is determined based on first capacitance between the plurality of electrodes and the first wiring and the second time constant is determined based on second capacitance between the plurality of electrodes and the second wiring and on short resistance between the first and second wirings.

According to another aspect of the present disclosure, a method for detecting a wiring short in a substrate includes applying a rising or falling measurement signal to a first wiring from among first and second wirings of a substrate, concurrently measuring response signals in first and second electrode elements capacitively coupled to the first and second wirings of the substrate, wherein the response signals are responsive to the applied measurement signal, and determining that a short circuit connection is present between the first and second wirings of the substrate according to a difference in the concurrently measured response signals in the first and second electrode elements.

BRIEF DESCRIPTION OF DRAWINGS

The above and other aspects, features, and advantages of the present disclosure will be more clearly understood from the following detailed description, taken in conjunction with the accompanying drawings, in which:

FIGS. 10A and 10B are schematic cross-sectional views illustrating a fan-in semiconductor package before and after being packaged;

DETAILED DESCRIPTION

Figure 1:
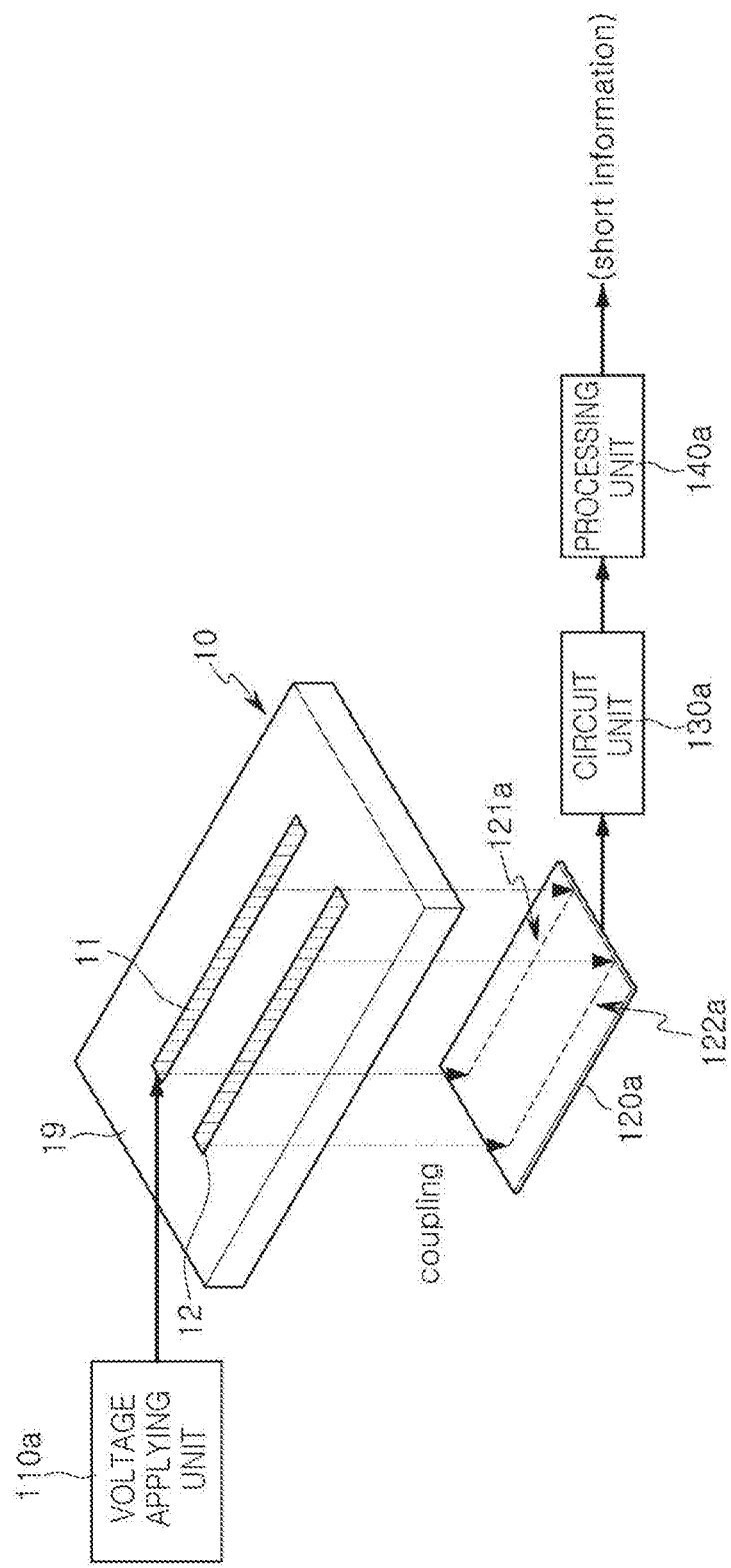
FIG. 1 illustrates an apparatus for detecting a wiring short of a substrate according to an embodiment of the present disclosure.

Hereinafter, embodiments of the present disclosure will be described as follows with reference to the attached drawings.

These embodiments are described in sufficient detail to enable those skilled in the art to practice the invention. It is to be understood that the various embodiments of the invention, although different, are not necessarily mutually exclusive. For example, structures, shapes, and sizes described as examples in one embodiment in the present disclosure may be implemented in another example embodiment without departing from the spirit and scope of the present disclosure. Further, modifications of positions or arrangements of elements in example embodiments may be made without departing from the spirit and scope of the present disclosure. The following detailed description is, therefore, not to be taken in a limiting sense, and the scope of the present disclosure is defined only by appended claims, appropriately interpreted, along with the full range of equivalents to which the claims are entitled. In the drawings, the same elements will be indicated by the same reference numerals.

FIG. 1 illustrates an apparatus for detecting a wiring short of a substrate according to an embodiment of the present disclosure.

Referring to FIG. 1, an apparatus for detecting a wiring short of a substrate according to an embodiment may include a voltage applying unit 110a including a voltage source circuit, an electrode unit 120a including a plurality of electrodes, a circuit unit 130a including a sensing circuit, and a processing unit 140a including a processor and may detect whether a first wiring 11 and a second wiring 12 of a substrate 10 are shorted to each other.

The substrate 10 may include a layer, in which the first and second wirings 11 and 12 are disposed, and an insulating layer 19 disposed below the layer. The first and second wirings 11 and 12 may be disposed on the same layer, but dispositions of the first and second wirings 11 and 12 are not limited thereto.

The voltage applying unit 110a including a voltage source or other signal source that applies a rising or falling measurement voltage to the first wiring 11 of the substrate 10. The voltage source of the voltage applying unit 110a may apply a measurement voltage to the first wiring 11 in a contact manner or a contactless manner. For example, the measurement voltage may have at least one of a pulse waveform, an impulse waveform, and a step waveform.

The electrode unit 120a includes a plurality of electrodes including a first electrode element 121a, coupled to the first wire 11 of the substrate 10, and a second electrode element 122a coupled to the second wire 12 of the substrate 10. In this case, the "coupling" (or two electrode elements/wires being "coupled") is defined as an electrical or capacitive connection between a plurality of conductive components that are in contact with each other or are adjacent by less than a predetermined spaced distance so as to exhibit non-negligible capacitance. For example, the electrode unit 120a may be coupled to the first and second wiring 11 and 12 if the electrode unit 120a receives electrical parameters or signals from the first and second wiring 11 and 12 in a contact manner or a contactless manner (e.g., without being in contact the first and second wirings 11 and 12. In particular, two elements may be capacitively coupled if the sensing circuit and processor can detect a capacitive coupling between the elements such that an electrical signal applied to one element results in a signal or artifact that can be detected by the sensing circuit and processor in the other element.

For example, the electrode unit 120a may have a shape of a conductive plate covering both the first and second wirings 11 and 12 when a width or spacing distance between the first and second wirings 11 and 12 is small, and may have a shape of a plurality of conductive wirings when the width or the spacing distance between the first and second wirings 11 and 12 is large.

The circuit unit 130a includes the sensing circuit which generates an output voltage based on a voltage or a current measured or detected between the first electrode element 121a and the second electrode element 122a. For example, the sensing circuit of the circuit unit 130a may measure/detect and filter the voltage to analyze a transient state of the voltage, or may measure/detect and integrate the current to provide an integrated value of the current. For example, the sensing circuit of the circuit unit 130a may amplify the voltage or the current to improve short determination accuracy of the processor 140a and may appropriately control a gain of amplification to cover a wide short resistance value.

The processor or processing unit 140a may generate first short information, corresponding to a short circuit connection having a resistance value greater than a reference resistance value between the first wiring 11 and the second wiring 12, based on a change rate of an output voltage after the output voltage rises or falls, depending on application of the measurement voltage.

A speed, at which the first voltage of the first electrode element 121a follows the measurement voltage applied to the first wiring 11, is substantially independent of the short between the first and second wirings 11 and 12. However, a speed, at which the second voltage of the second electrode element 122a follows the measurement voltage applied to the first wiring 11, may be affected by a short resistance value between the first and second wirings 11 and 12 and may be decreased as the short resistance value is increased.

For example, as the short resistance between the first and second wirings 11 and 12 is increased, the voltage change rate of the first electrode element 121a and the voltage change rate of the second electrode element 122a may be further unbalanced.

Accordingly, the output voltage may rapidly rise or fall firstly according to the voltage change rate of the first electrode element 121a, and may slowly rise or fall secondly according to the voltage change rate of the second electrode element 122a.

The processor or processing unit 140a may detect the slow rise or fall of the output voltage to easily determine whether a short occurs between the first wiring 11 and the second wiring 12 when a resistance value depending on the short between the first wiring 11 and the second wiring 12 is greater than a reference resistance value.

The processor 140a may be implemented in a computing environment including a processor, a memory, an input device, an output device, and communications connection.

Figure 2:
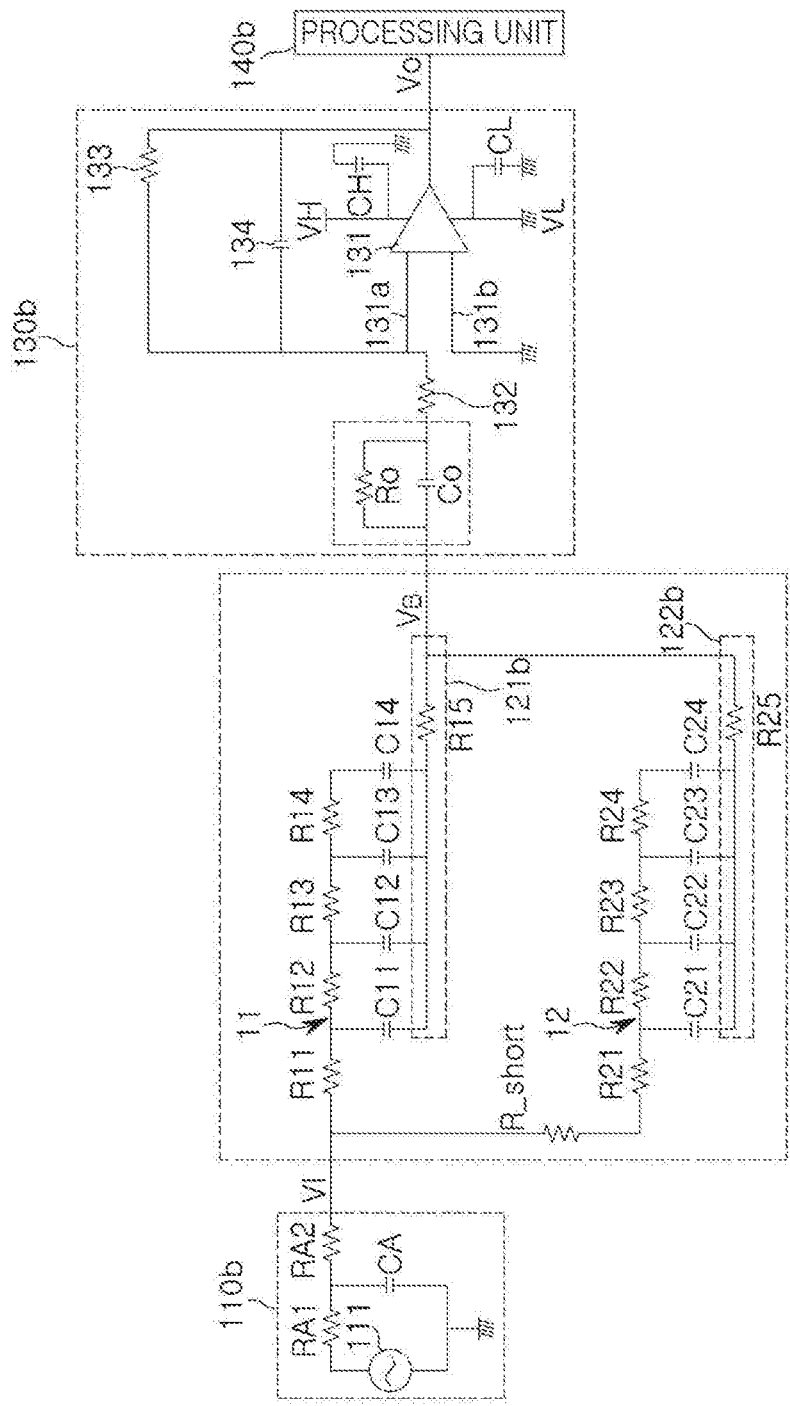
FIG. 2 is a circuit diagram illustrating an equivalent circuit of an apparatus for detecting a wiring short in a substrate according to an embodiment of the present disclosure.

FIG. 2 is a circuit diagram illustrating an equivalent circuit of an apparatus for detecting a wiring short in a substrate according to an embodiment of the present disclosure.

Referring to FIG. 2, the equivalent circuit of the apparatus for detecting a wiring short in a substrate according to an embodiment may include a voltage applying unit 110b, first and second electrode elements 121b and 122b, a circuit unit 130b, and a processing unit 140b.

The voltage applying unit 110b may include a voltage source 111 or other signal source, a first input resistor RA1, a second input resistor RA2, and an input capacitor CA, and may output a measurement voltage VI.

The first wiring 11 may be represented by a plurality of equivalent resistors R11, R12, R13, and R14, and the capacitive coupling between the first wiring 11 and the first electrode element 121b may be represented by equivalent capacitors C11, C12, C13, and C14. The first electrode element 121b may be represented by the equivalent resistance R15.

In this case, the resistance value of each "equivalent resistor" may be in proportion to lengths and resistivity of the first and second wirings 11 and 12 and in inverse proportion to widths thereof, and may be defined as having equivalent resistance and equivalent conductance.

A first time constant from the first wiring 11 to the first electrode element 121b may be determined by a combination of a first equivalent resistor based on the equivalent resistors R11, R12, R13, R14, and R15, and a first equivalent capacitor based on the equivalent capacitors C11, C12, C13, and C14.

The second wiring 12 may be represented by a plurality of equivalent resistors R21, R22, R23, and R24, and the capacitive coupling between the second wiring 12 and the second electrode element 122b may be represented by the equivalent capacitors C21, C22, C23, and C24. The second electrode element 122b may be represented by the equivalent resistance R25.

A second time constant from the second wiring 12 to the second electrode element 122b may be determined by a combination of a second equivalent resistor based on the equivalent resistors R21, R22, R23, R24, and R25, and a second equivalent resistor based on the equivalent capacitors C21, C22, C23, and C24.

A short circuit connection between the first and second wirings 11 and 12 may be represented by a short resistance value R_short between the first wiring 11 and the second wiring 12 which does not substantially affect the first time constant, but may be added to the second equivalent resistor of the second time constant.

Accordingly, a difference between the second time constant and the first time constant may be increased as the short resistance value R_short is increased.

The sensing circuit of the circuit unit 130a/130b may be electrically connected to the first and second electrode elements 121a/121b and 122a/122b such that a change rate of an output voltage Vo is determined based on a first time constant based on first capacitance between the first electrode element 121a and the first wiring 11 and a second time constant based on second capacitance between the second electrode element 122a and the second wiring 12 and a short resistor R_short between the first and second wirings 11 and 12.

The sensing circuit of the circuit unit 130b may receive a voltage VB of the first and second electrode elements 121b and 122b through an output resistor Ro and an output capacitor Co.

The sensing circuit of the circuit unit 130b may include an amplifier 131, a first resistor 132, a second resistor 133, and a capacitor 134.

The amplifier 131 may have an output terminal and first and second input terminals 131a and 131b, and the output terminal may be electrically connected to the processor 140b. For example, the amplifier 131 may have an operational amplifier (OP-AMP) structure and may receive a high-voltage VH, associated with a high-voltage capacitor CH, and a low voltage VL associated with a low-voltage capacitor CL.

The first input terminal 131a may correspond to an inverting/negative input terminal of an operational amplifier OP-AMP, and the second input terminal 131b may correspond to a non-inverting/positive input terminal of the operational amplifier OP-AMP and may be connected to a ground.

The first resistor 132 may be electrically connected between the first input terminal 131a and the first and second electrode elements 121b and 122b.

The second resistor 133 may be electrically connected between the first input terminal 131a and the output terminal.

The capacitor 134 may be electrically connected between the first input terminal 131a and the output terminal.

Accordingly, the circuit unit 130b may filter the voltage VB between the first and second electrode elements 121b and 122b or may integrate a current difference value of the first and second electrode elements 121b and 122b to generate the output voltage Vo.

An amplification gain of the output voltage Vo may be adjusted based on a resistance value of the first resistor 132 and a resistance value of the second resistor 133 to improve short determination accuracy of the processing unit and to widen a short resistance value covering range.

Figure 3:
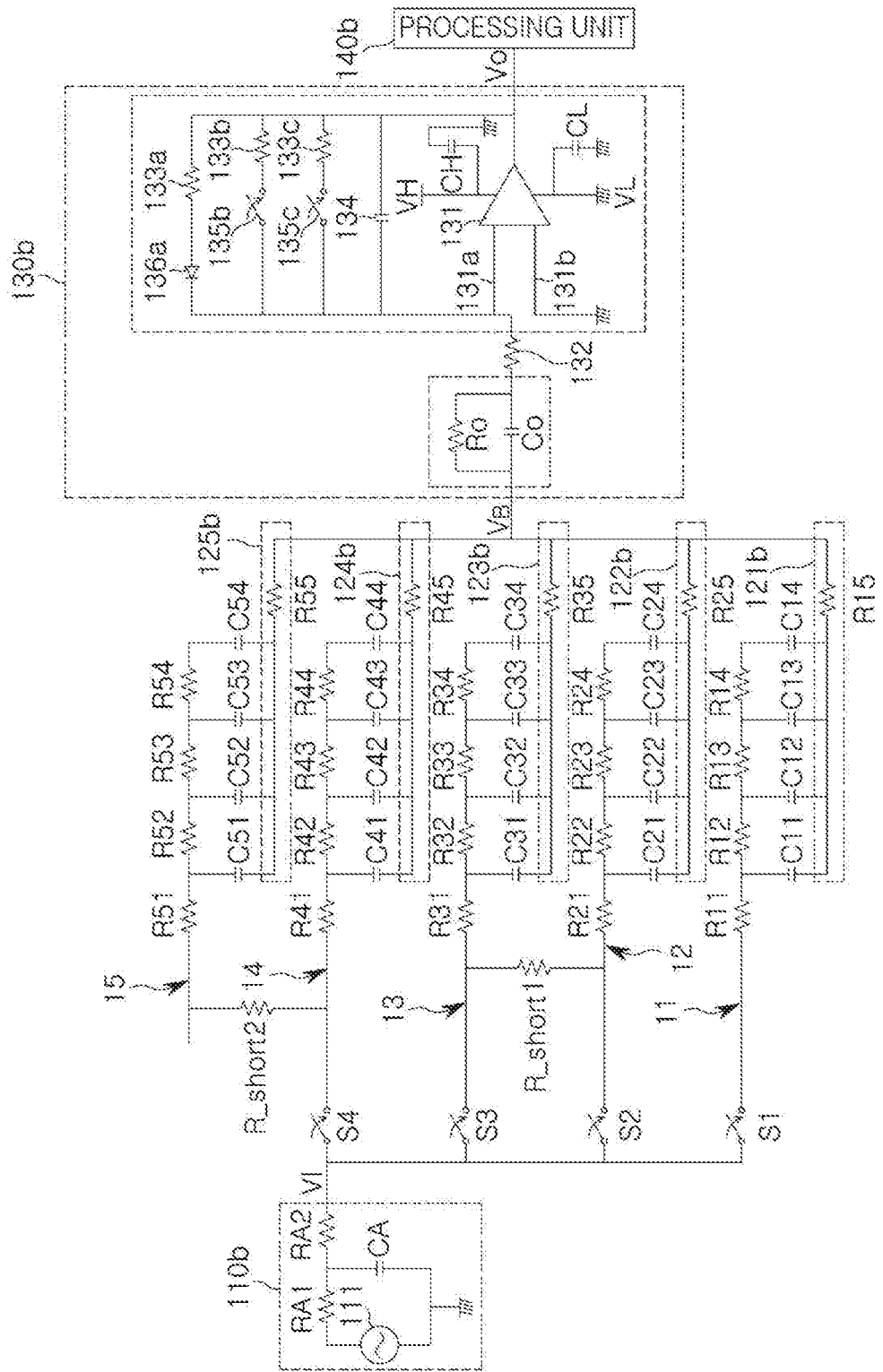
FIG. 3 is a circuit diagram illustrating an equivalent circuit of an extending structure of an apparatus for detecting a wiring short in a substrate according to an embodiment of the present disclosure.

FIG. 3 is a circuit diagram illustrating an equivalent circuit including an extending structure of an apparatus for detecting a wiring short in a substrate according to an embodiment of the present disclosure.

Referring to FIG. 3, a substrate may include first, second, third, fourth, and fifth wirings 11, 12, 13, 14, and 15. The second and third wirings 12 and 13 may be connected to each other with a short circuit connection therebetween that may be represented by a first short resistance value R_short1 higher than a reference resistance value, and the fourth and fifth wirings 14 and 15 may be connected to each other with a short circuit connection therebetween that may be represented by a second short resistance value R_Short2 less than or equal to the reference resistance value.

The voltage applying unit 110b may apply a rising or falling measurement voltage to the first, second, third, and fourth wirings 11, 12, 13, and 14.

The voltage applying unit 110b may include a first switch unit having an ON/OFF state controlled such that the measurement voltage is selectively applied to one of the first, second, third and fourth wirings 11, 12, 13, and 14 according to a control signal. The control signal may be generated by the processor 140b and may be generated based on a measurement schedule (for example, an ON/OFF truth table, a control signal applying time, or the like) stored in the processor 140b.

The first switch unit may include switches S1, S2, S3, and S4, respectively electrically connected to the first, second, third, and fourth wirings 11, 12, 13, and 14.

For example, the processing unit 140b may generate a control signal such that the switches S1, S2, S3, and S4 sequentially enter an ON state, and thus, may sequentially detect whether the first, second, third and fourth wirings 11, 12, 13, and 14 are shorted with respect to other wirings.

The above-described electrode unit may include first, second, third, fourth, and fifth electrode elements 121b, 122b, 123b, 124b, and 125b.

The third wiring 13 may be represented by a plurality of equivalent resistors R31, R32, R33, and R34, and the capacitive coupling between the third wiring 13 and the third electrode element 123b may be represented by equivalent capacitors C31, C32, C33, and C34. The third electrode element 123b may be represented by the equivalent resistance R35.

The fourth wiring 14 may be represented by a plurality of equivalent resistances R41, R42, R43, and R44, and the capacitive coupling between the fourth wiring 14 and the fourth electrode element 124b may be represented by equivalent capacitors C41, C42, C43, and C44. The fourth electrode element 124b may be represented by the equivalent resistance R45.

The fifth wiring 15 may be represented by a plurality of equivalent resistances R51, R52, R53, and R54, and the capacitive coupling between the fifth wiring 15 and the fifth electrode element 125b may be represented by equivalent capacitors C51, C52, C53, and C54. The fifth electrode element 125b may be represented by the equivalent resistance R55.

The sensing circuit of the circuit unit 130b may further include third and fourth resistors 133b and 133c connected to the second resistor 133a in parallel. A resistance value of each of the third and fourth resistors 133b and 133c may be different from a resistance value of the second resistor 133a.

The circuit unit 130b may further include a second switch unit electrically connected to at least one of the second, third, and fourth resistors 133a, 133b, and 133c having an ON/OFF state controlled depending on the control signal. The circuit unit may further include a diode 136a.

The control signal, applied to the first switch unit, and the control signal, applied to the second switch unit, may be synchronized with each other. The second switch unit may include switches 135b and 135c, respectively electrically connected to (e.g., respectively connected in series to) the third and fourth resistors 133b and 133c.

An amplification gain of the output voltage Vo may be adjusted depending on the ON/OFF state of the switch(es) 135b and 135c. Thus, short determination accuracy of the processing unit 140b may be improved, and a short resistance value covering range of the processing unit 140b may be widened.

Figure 4A:
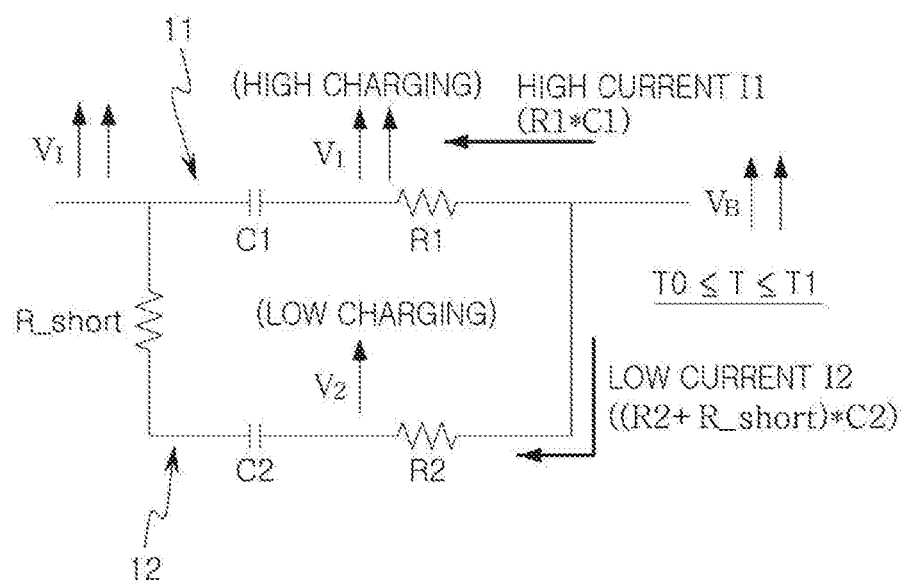
FIG. 4A illustrates a current flow of first and second wirings in a first state of an apparatus for detecting a wiring short in a substrate according to an embodiment of the present disclosure during a first time interval [T0-T1]

FIG. 4A illustrates a current flow of first and second wirings in a first state of an apparatus for detecting a wiring short in a substrate according to an embodiment of the present disclosure during a first time interval [T0-T1].

Referring to FIG. 4A, the figure depicts an illustrative situation where a first current I1 of a first electrode element (e.g., I1) is greater than a second current I2 of a second electrode element (e.g., I2) at a time T between a time point T0, at which an applied measurement voltage VI rises or falls, and a first time point T1.

A first time constant of the first wiring 11 may be R1*C1 based on a first equivalent resistor R1 and a first equivalent capacitor C1. A second time constant of the second wiring 12 may be (R2+R_short)*C2 based on a second equivalent resistor R2, a second equivalent capacitor C2, and a short resistance value R_short.

Since the second time constant (R2+R_short)*C2 is greater than the first time constant R1*C1, the first equivalent capacitor C1 may be charged more rapidly than the equivalent capacitor C2 depending on a rapid rise of a measurement voltage VI. Accordingly, the first voltage V1 of the first electrode element may rise more rapidly than the second voltage V2 of the second electrode element.

Accordingly, a voltage VB between the first and second electrode elements may rise rapidly depending on the rapid rise of the measurement voltage VI and the rapid rise of the first voltage V1.

Figure 4B:
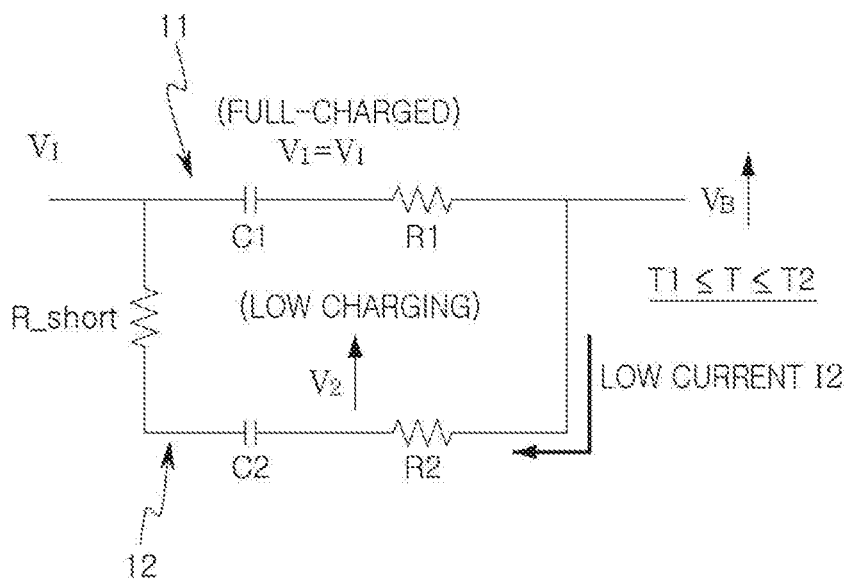
FIG. 4B illustrates a current flow of first and second wirings in a second state of an apparatus for detecting a wiring short in a substrate according to an embodiment of the present disclosure during a second time interval [T1-T2]

FIG. 4B illustrates a current flow of first and second wirings in a second state of an apparatus for detecting a wiring short in a substrate according to an embodiment of the present disclosure during a second time interval [T1-T2].

Referring to FIG. 4B, the figure depicts an illustrative situation where a first current of a first electrode element may be significantly decreased depending on substantial completion of charging of the first equivalent capacitor, and a first voltage V1 and a measurement voltage VI may be substantially the same.

Accordingly, the second current I2 of the second electrode element is greater than the first current of the first electrode element at a time T between the first time point T1 and a second time point T2.

In this case, a second voltage V2 may be increased relatively slowly and continuously, and a voltage VB between the first and second electrode elements may be relatively low and may rise relatively slowly depending on a continuous flow of the continuous second current I2.

As a result, a processing unit 140a/140b may generate first short information upon determining that a short circuit connection having a resistance value greater than a reference value is present based on a change rate of an output voltage when the second current I2 of the second electrode element is greater than the first current of the first electrode element.

Since the first and second wirings 11 and 12 are parallel to each other, overall impedance of first and second wirings 11 and 12 may be increased as a short resistance value R_short is increased.

When the first and second wirings 11 and 12 are not shorted by each other, a short resistance value R_short may be interpreted as being actually infinite. Therefore, overall impedance of the first and second wirings 11 and 12 may be greatest when the first and second wirings 11 and 12 are not shorted to each other.

A rising height of a voltage VB between the first and second electrode elements may be decreased as the overall impedance of the first and second wirings 11 and 12 is increased.

For example, the voltage VB between the first and second electrode elements may be lowest when the first and second wirings 11 and 12 are not shorted by each other and may be greatest when the short resistance value R_short is significantly small.

As a result, a processing unit 140*a*/140*b* may generate second short information, corresponding to determining that a short circuit connection having a resistance value less than or equal to a reference resistance value between the first wiring 11 and the second wiring 12, based on a height at which the output voltage rises or falls, depending on application of a measurement voltage VI.

For example, the apparatus and method for detecting a wiring short in a substrate according to an embodiment may clearly detect a short in both a case in which the short resistance value R_short is relatively large and a case in which the short resistance value R_short is relatively small.

Figure 5:
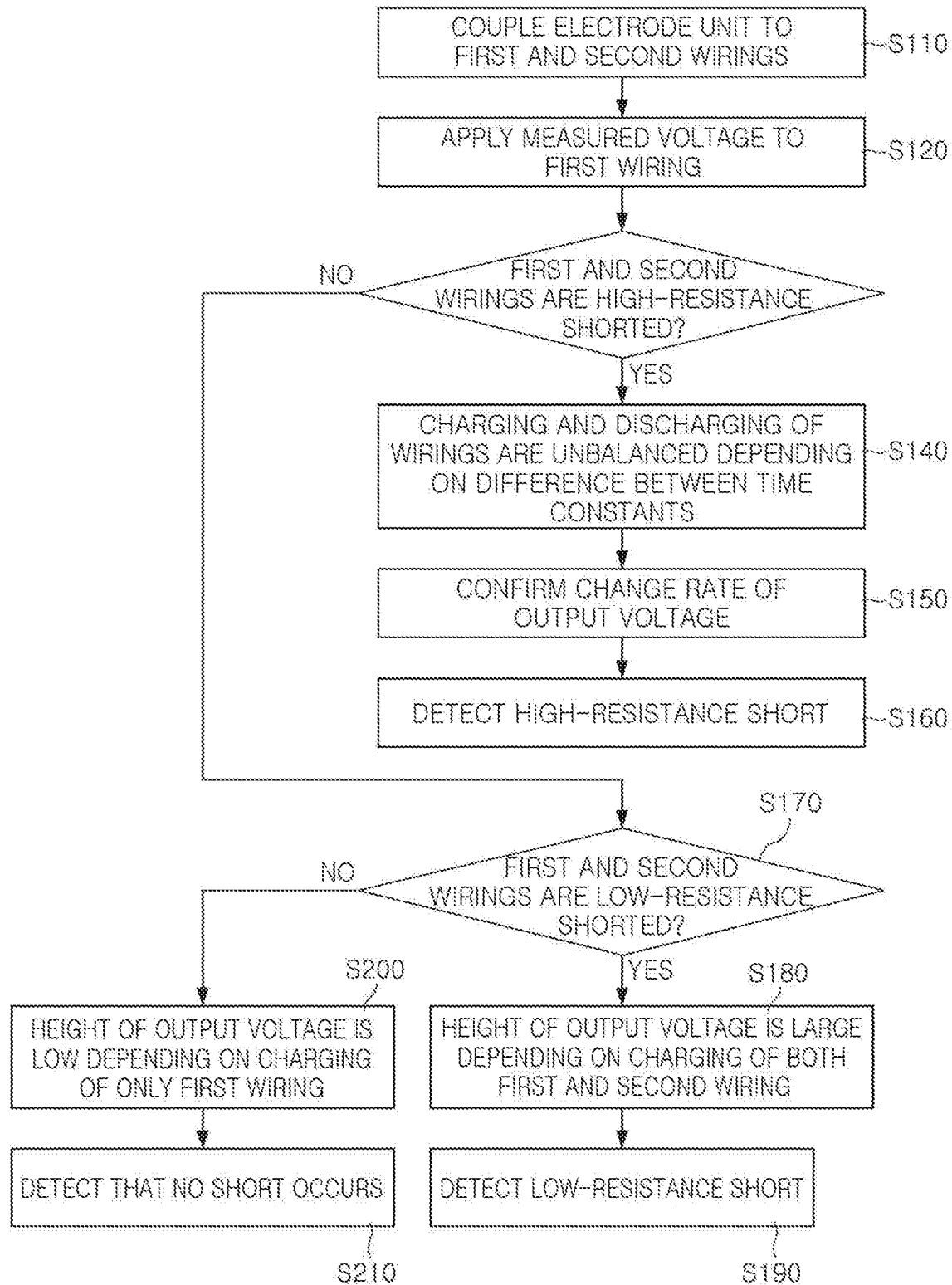
FIG. 5 is a flowchart illustrating a method for detecting a wiring short in a substrate according to an embodiment of the present disclosure.

FIG. 5 is a flowchart illustrating a method for detecting a wiring short in a substrate according to an embodiment of the present disclosure.

Referring to FIG. 5, in an apparatus according to the method for detecting a wiring short in a substrate, an electrode unit may be coupled to first and second wirings of the substrate (S110). A measurement voltage may be applied to the first wiring of the substrate (S120).

When the first and second wirings are high-resistance shorted by each other (S130), charging and/or discharging of the first and second wirings may be unbalanced depending on a difference between first and second time constants (S140).

The apparatus according to the method for detecting a wiring short in a substrate may confirm a change rate or a current integration value of an output voltage (S150) to detect high-resistance short or first short information of the first and second wirings (S160).

Accordingly, the apparatus according to the method for detecting a wiring short in a substrate may clearly detect the short of the first and second wirings when a short resistance value R_short is relatively large.

When the first and second wirings are not high-resistance shorted by each other but are low-resistance shorted by each other (S170), height of the output voltage is relatively large depending on charging of both the first and second wiring (S180).

The apparatus according to the method for detecting a wiring short in a substrate may confirm the height of the output voltage to detect the low-resistance short or second short information (S190).

When the first and second wirings are not shorted by each other, the height of the output voltage may be relatively low depending on the charging of only the first wiring among the first and second wirings (S200).

The apparatus according to the method for detecting a wiring short in a substrate may confirm the small height of the output voltage to detect that no short occurs (S210). In this case, whether the height of the output voltage is large or small may be defined as a reference resistance value.

Accordingly, the apparatus according to the method for detecting a wiring short in a substrate may clearly detect a short in both the case in which the short resistance value R_short is relatively large and the case in which the short resistance value R_short is small.

Figure 6A:
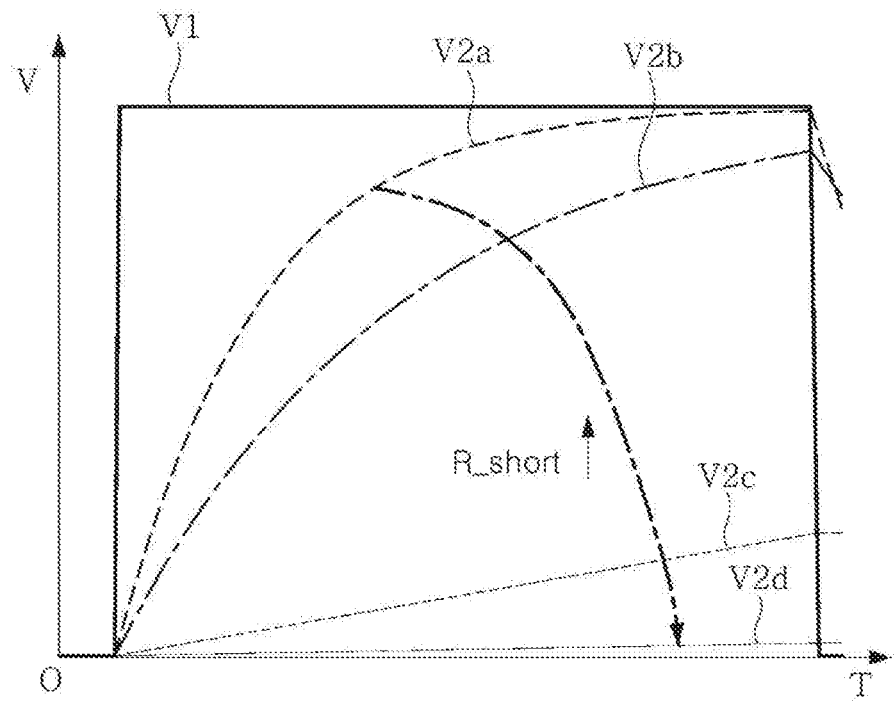
FIG. 6A is a graph illustrating a first voltage and a second voltage of a first electrode element and a second electrode element of an apparatus and a method for detecting a wiring short in a substrate according to an embodiment of the present disclosure.

FIG. 6A is a graph illustrating a first voltage and a second voltage of a first electrode element and a second electrode element of an apparatus and a method for detecting a wiring short in a substrate according to an embodiment.

Referring to FIG. 6A, a first voltage V1 of a first electrode element may rise or fall more rapidly than second voltages V2*a*, V2*b*, V2*c*, and V2*d* of a second electrode element.

A rising speed of the second voltages V2*a*, V2*b*, V2*c*, and V2*d* may be decreased as a short resistance value R_short is increased.

Figure 6B:
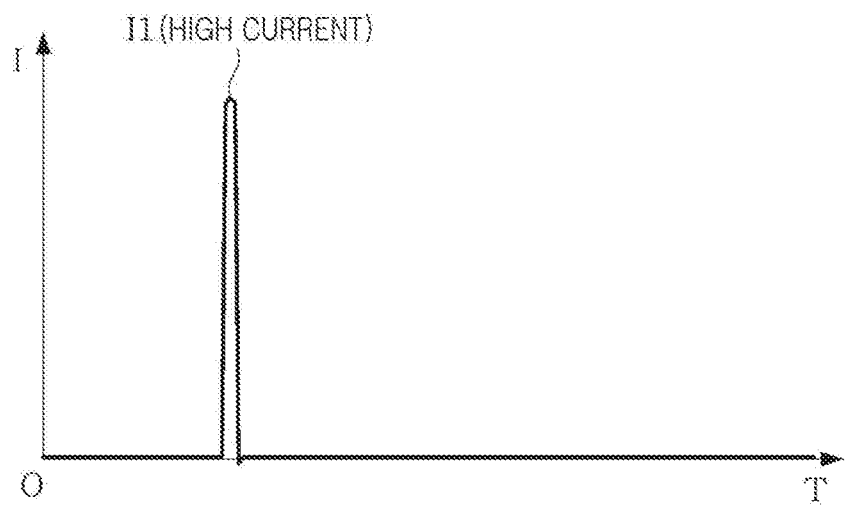
FIG. 6B is a graph illustrating a first current of a first electrode element of an apparatus and a method for detecting a wiring short in a substrate according to an embodiment of the present disclosure.

FIG. 6B is a graph illustrating a first current of a first electrode element of an apparatus and a method for detecting a wiring short in a substrate according to an embodiment.

Referring to FIG. 6B, a first current I1 of a first electrode element may rapidly rise or fall.

Figure 6C:
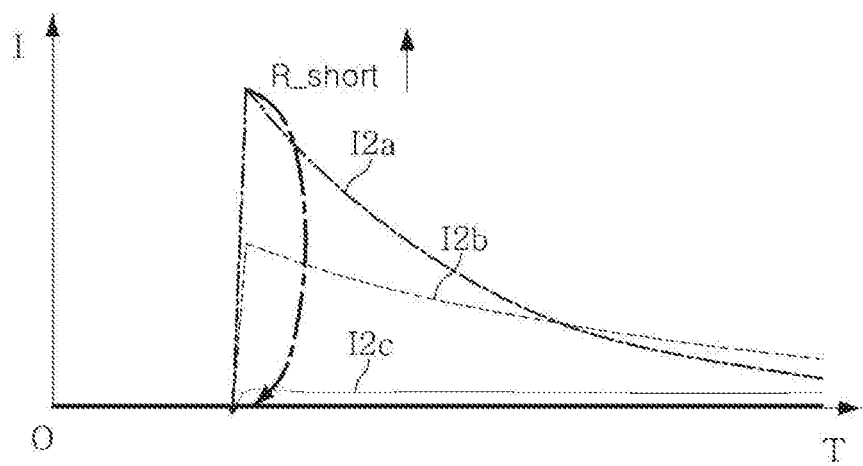
FIG. 6C is a graph illustrating a second current of a second electrode element of an apparatus and a method for detecting a wiring short in a substrate according to an embodiment of the present disclosure.

FIG. 6C is a graph illustrating a second current of a second electrode element of an apparatus and a method for detecting a wiring short in a substrate according to an embodiment.

Referring to FIG. 6C, second currents I2*a*, I2*b*, and I2*c* of a second electrode element may rise or fall relatively slowly, and may rise or fall more slowly as a short resistance value R_short is increased.

Figure 6D:
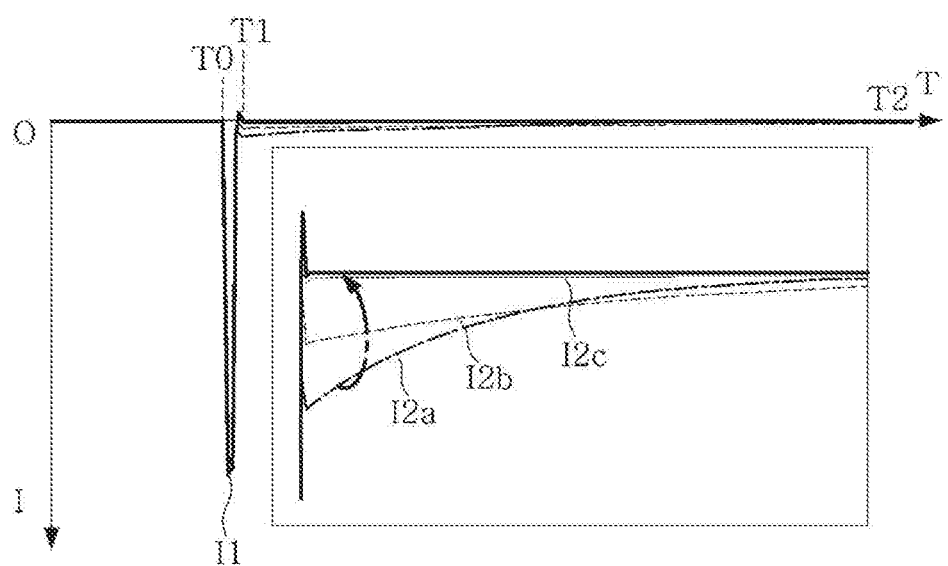
FIG. 6D is a graph illustrating a circuit unit input current of an apparatus and a method for detecting a wiring short in a substrate according to an embodiment of the present disclosure.

FIG. 6D is a graph illustrating a circuit unit input current of an apparatus and a method for detecting a wiring short in a substrate according to an embodiment of the present disclosure.

Referring to FIG. 6D, a dominant current of the circuit input current may be a first current I1 from a time point T0, at which a measurement voltage rises or falls, to a first time point T1, and may be a second current I2 from the first time point T1 to a second time point T2.

An apparatus and a method for detecting a wiring short in a substrate according to an embodiment may detect a low-resistance short of first and second wirings based on a circuit unit input current when a dominant current of the circuit unit input current is the first current I1, and may detect a high-resistance short of the first and second wirings based on the circuit unit input current when the dominant current of the circuit unit input current is a second current I2.

Figure 6E:
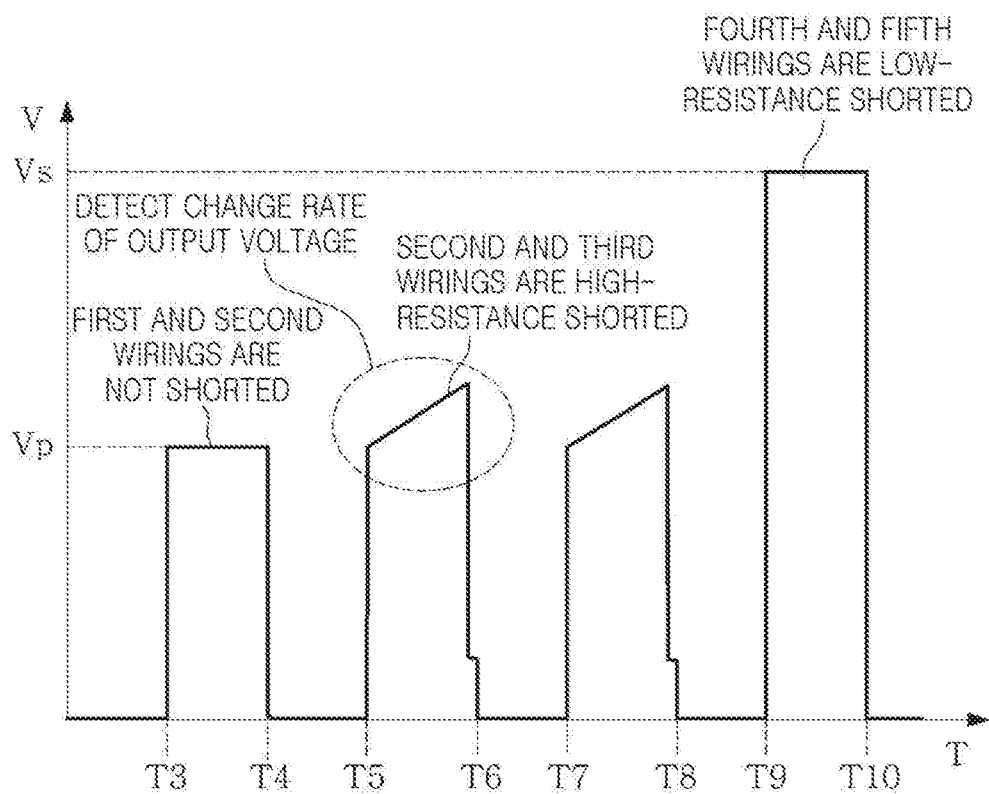
FIG. 6E is a graph illustrating an output voltage of an apparatus and a method for detecting a wiring short in a substrate according to an embodiment of the present disclosure.

FIG. 6E is a graph illustrating an output voltage of an apparatus and a method for detecting a wiring short in a substrate according to an embodiment.

Referring to FIG. 6E, an apparatus and a method for detecting a wiring short in a substrate according to an embodiment may sequentially determine whether the first, second, third, fourth, and fifth wirings, illustrated in FIG. 3, are shorted.

For a time from a third time point T3 to a fourth time point T4, a measurement voltage may be applied to one of the first and second wirings. When the first and second wirings are not shorted to each other, a height of the output voltage may be a relatively small height Vp.

For a time from a fifth time point T5 to a sixth time point T6 or a time from a seventh time point T7 to an eighth time point T8, the measurement voltage may applied to one of the second and third wirings. When the second and third wirings are high-resistance shorted by each other, the output voltage may rise slowly after rising firstly.

The apparatus and a method for detecting a wiring short in a substrate according to an embodiment may detect a slow rise of the output voltage to detect a high-resistance short.

For a time from a ninth time point T9 to a tenth time point T10, the measurement voltage may be applied to one of the fourth and fifth wiring. When the fourth and fifth wirings are low-resistance shorted by each other, the height of the output voltage may be a relatively large height Vs.

In the apparatus and method for detecting a wiring short in a substrate according to an embodiment, a voltage height corresponding to a reference resistance value may be between the small height Vp and the large height Vs.

Figure 7:
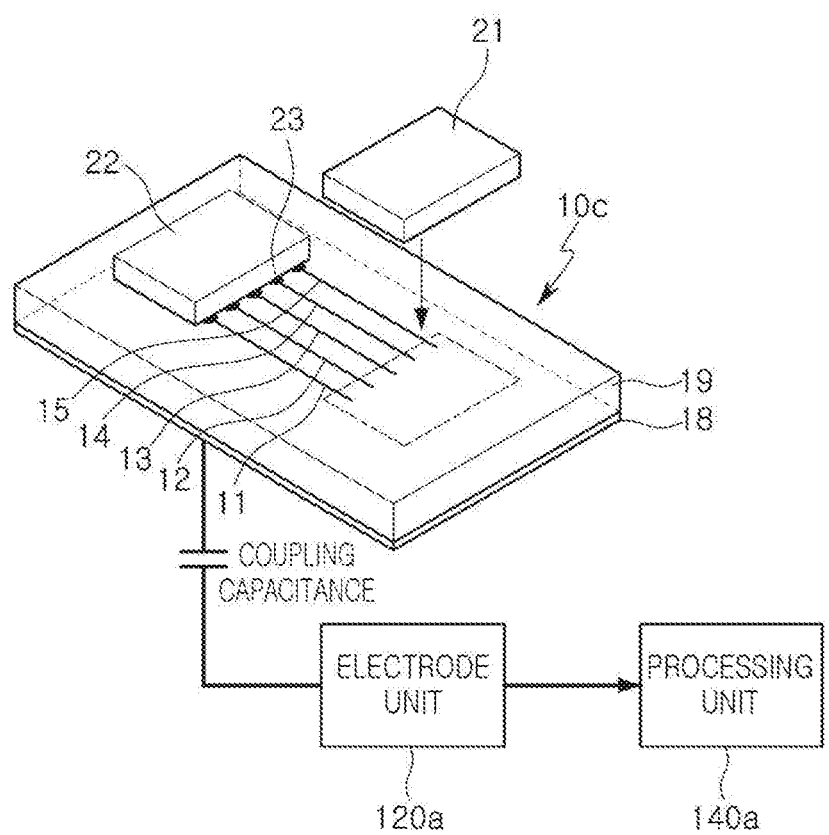
FIG. 7 illustrates a modified shape of a substrate, capable of being used in an apparatus and a method for detecting a wiring short in a substrate according to an embodiment of the present disclosure.

FIG. 7 illustrates a modified shape of a substrate, capable of being used in an apparatus and a method for detecting a wiring short in a substrate according to an embodiment.

Referring to FIG. 7, a substrate 10c may include a conductive layer 18, disposed on a different layer from first, second, third, fourth wirings, and/or fifth wiring 11, 12, 13, 14, and/or 15, overlapping the first, second, third, fourth, and/or fifth wiring 11, 12, 13, 14, and/or 15 in a laminated direction. In addition, the substrate 10c may include an insulating layer 19 between the conductive layer 18 and a layer on which the first, second, third, fourth, and/or fifth wiring 11, 12, 13, 14, and/or 15 is disposed.

The electrode unit 120a may be indirectly connected to the first, second, third, fourth, and/or fifth wiring 11, 12, 13, 14, and/or 15 through the conductive layer 18 of the substrate 10c.

Accordingly, the electrode unit 120a may be more easily coupled to the first, second, third, fourth, and/or fifth wiring 11, 12, 13, 14, and/or 15, and may be coupled to the first, second, third, fourth, and/or fifth wiring 11, 12, 13, 14, and/or 15 when a distance between a surface of the substrate 10c and the first, second, third, fourth, and/or fifth wiring 11, 12, 13, 14, and/or 15 is long.

For example, the insulating layer 19 may be formed of an insulating material such as prepreg, Ajinomoto Build-up Film (ABF), FR-4, bismaleimide triazine (BT), or the like. The insulating material may be a thermosetting resin such as an epoxy resin, a thermoplastic resin such as a polyimide, a resin in which the thermosetting resin or the thermoplastic resin is impregnated together with an inorganic filler in a core material as a glass fiber (a glass cloth or a glass fabric). According to a design, the insulating layer 19 may be formed of a photoimageable dielectric (PID) resin. For example, the insulating layer 19 may be implemented as a general copper clad laminate (CCL) or a glass or ceramic-based insulating material depending on required material properties.

For example, the first, second, third, fourth, and fifth wirings 11, 12, 13, 14, and 15 and the conductive layer 18 may be implemented with a conductive material such as copper (Cu), aluminum (Al), silver (Ag), tin (Sn), gold (Au), nickel (Ni), lead (Pb), titanium (Ti), or alloys thereof, and may be formed using a plating method such as chemical vapor deposition (CVD), physical vapor deposition (PVD), sputtering, subtractive, additive, semi-additive process (SAP), modified semi-additive process (MSAP), or the like. The first, second, third, fourth, and fifth wirings 11, 12, 13, 14, and 15 and the conductive layer 18 may have a structure similar to a copper redistribution layer (RDL).

The substrate 10c may provide a space in which a first chipset 21 and a second chipset 22 are disposed. The first and second chipsets 21 and 22 may be electrically connected to the first, second, third, fourth, and/or fifth wiring 11, 12, 13, 14, and/or 15 through an electrical connection structure or member 23. The electrical connection structure 23 may be implemented as an electrode, a pin, a solder ball, a land, or the like.

In the apparatus and the method for detecting a wiring short in a substrate according to an embodiment, the method may further include disposing the first chipset 21 on the substrate 10c depending on first short information and/or second short information when there is no short between the first, second, third, fourth, and/or fifth wirings 11, 12, 13, 14, and/or 15.

For example, the apparatus and the method for detecting a wiring short in a substrate according to an embodiment may detect a wiring short in a contactless manner through a component, not disposed on the substrate 10c.

The substrate and the first and second chipsets, disclosed in the specification, may be implemented according to a fan-out semiconductor package to be described below. Additional descriptions will be made with reference to FIGS. 8 to 15 to help understand the fan-out semiconductor package.

Figure 8:
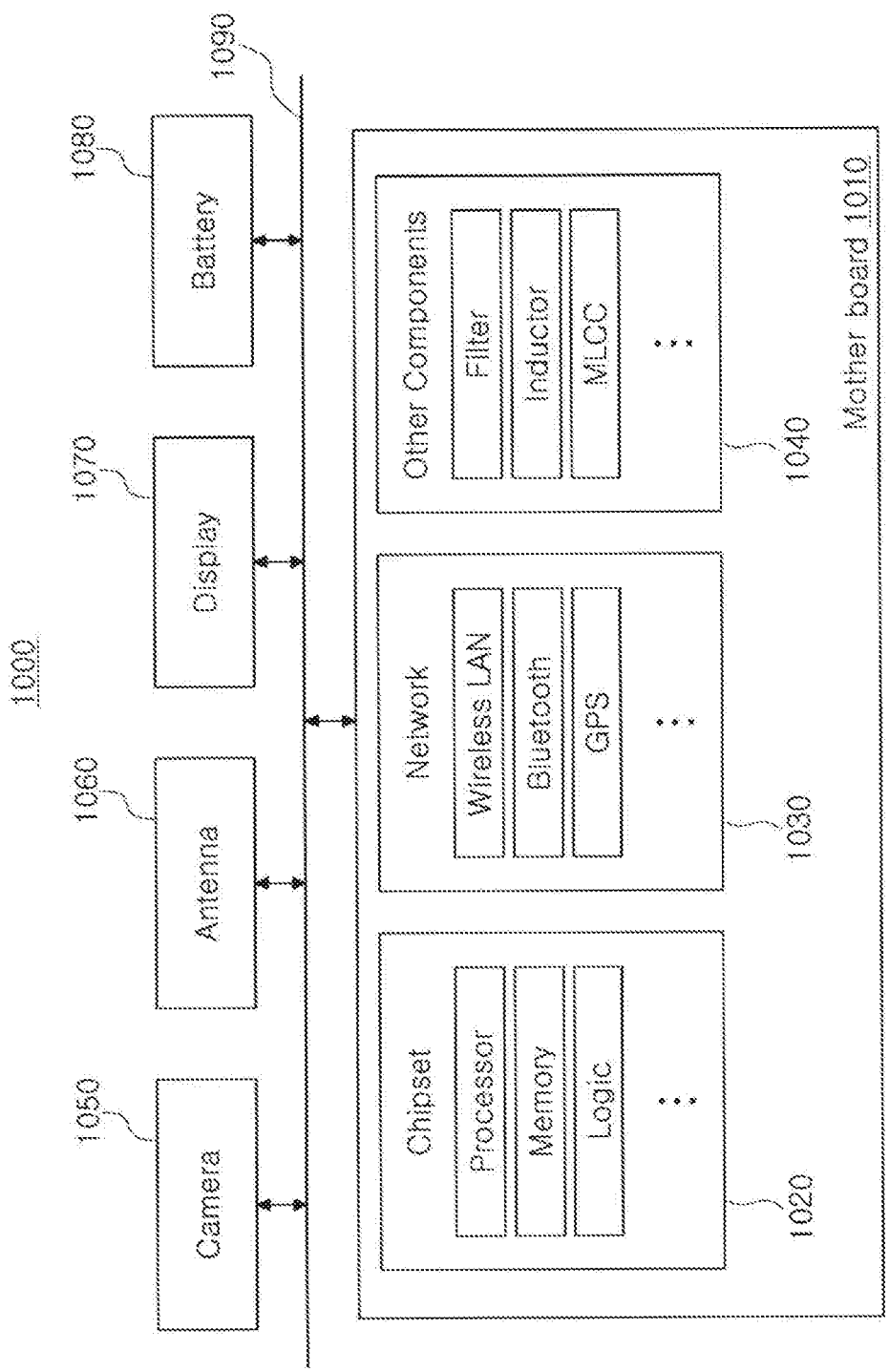
FIG. 8 is a schematic block diagram illustrating an example of an electronic device.

FIG. 8 is a schematic block diagram illustrating an example of an electronic device.

Referring to FIG. 8, an electronic device 1000 may accommodate a mainboard 1010 or mother board therein. The mainboard 1010 may include chip related components 1020, network related components 1030, and other components 1040, and the like, physically and/or electrically connected. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec, not illustrated, a video codec, not illustrated, a power amplifier, not illustrated, a compass, not illustrated, an accelerometer, not illustrated, a gyroscope, not illustrated, a speaker, not illustrated, a mass storage unit (for example, a hard disk drive), not illustrated, a compact disk (CD) drive, not illustrated, a digital versatile disk (DVD) drive, not illustrated, or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 9:
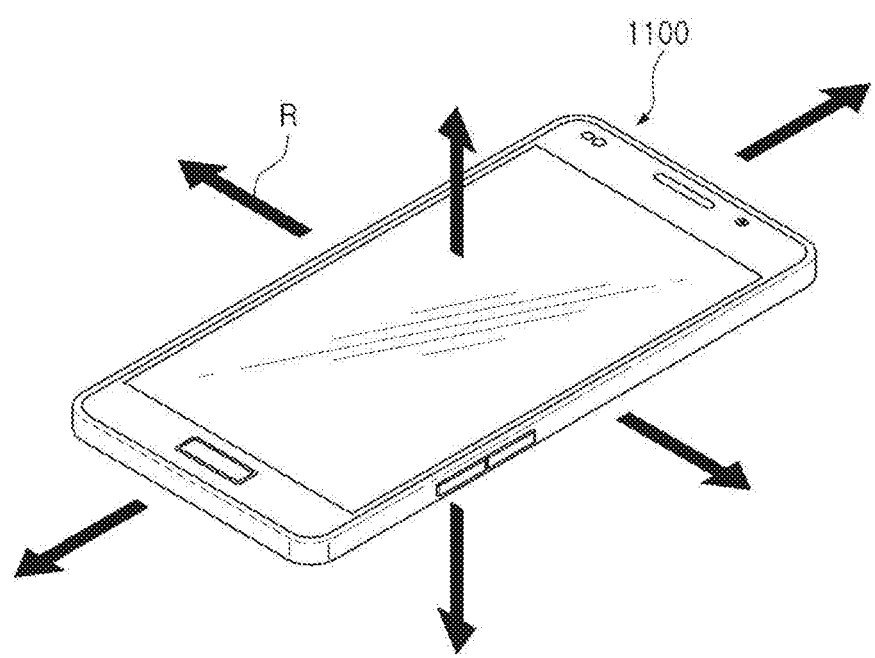
FIG. 9 is a schematic perspective view illustrating an example of an electronic device.

FIG. 9 is a schematic perspective view illustrating an example of an electronic device.

Referring to FIG. 9, an electronic device may be, for example, a smartphone 1100. A radio-frequency integrated circuit (RF IC) may be applied to the smartphone 1100 in the form of a semiconductor package, and an antenna may be applied in the form of a substrate or a module. In the smart phone 1100, a radio-frequency integrated circuit and the antenna may be electrically connected to each other to perform radiation (R) of an antenna signal in various directions. A semiconductor package, including a radio-frequency integrated circuit, and a substrate or module, including an antenna, may be applied to electronic devices such as a smartphone in various forms.

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

Hereinafter, the fan-in semiconductor package and the fan-out semiconductor package will be described in more detail with reference to the drawings.

FIGS. 10A and 10B are schematic cross-sectional views illustrating a fan-in semiconductor package before and after being packaged.

Figure 11:
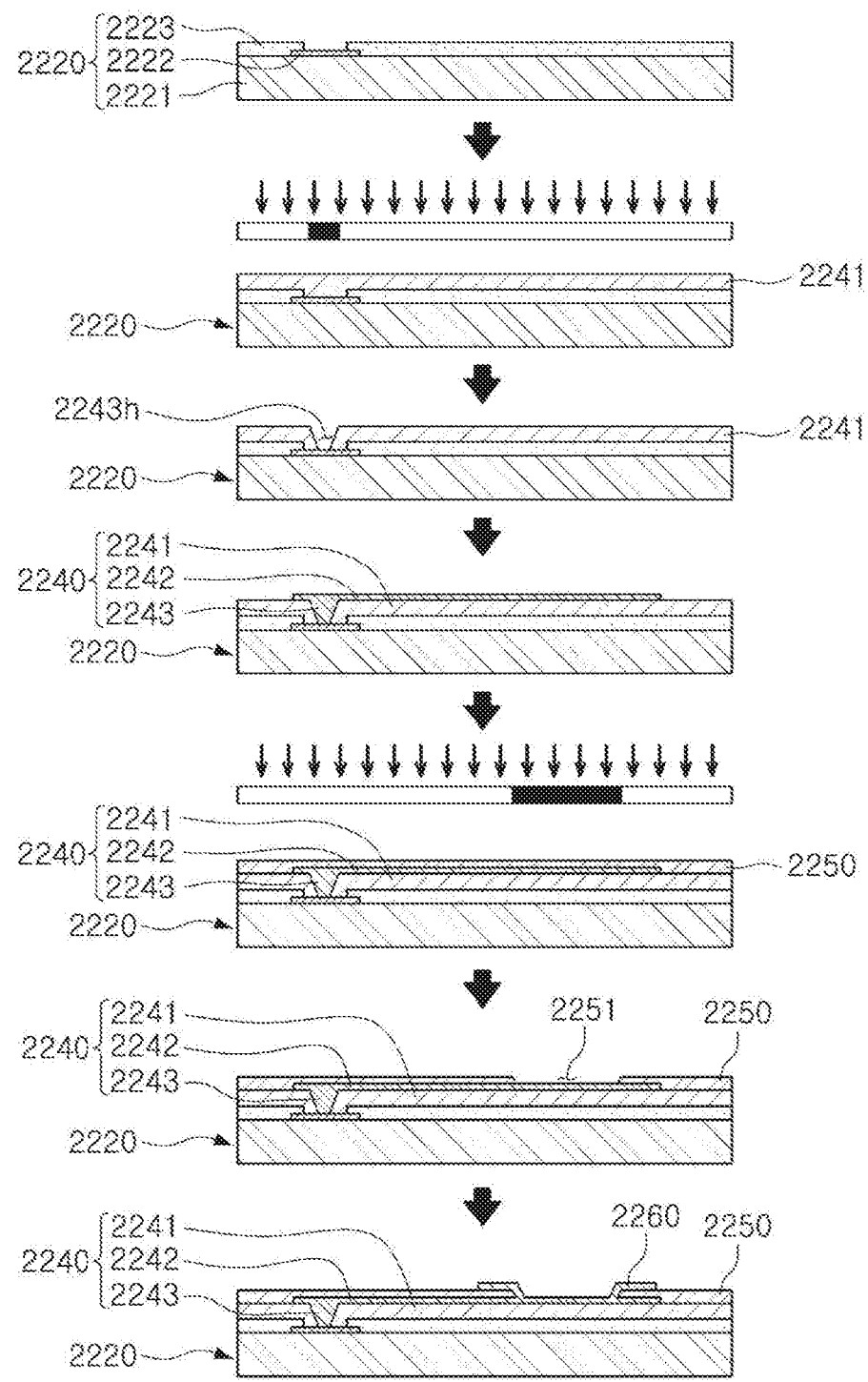
FIG. 11 is schematic cross-sectional views illustrating a packaging process of a fan-in semiconductor package.

FIG. 11 is schematic cross-sectional views illustrating a packaging process of a fan-in semiconductor package.

Referring to FIGS. 10A, 10B, and 11, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least a portion of the connection pads 2222. In this case, since the connection pads 2222 may be significantly small, it may be difficult to mount the integrated circuit (IC) on an intermediate level printed circuit board (PCB) as well as on a mainboard of an electronic device, and the like.

Accordingly, to redistribute the connection pads 2222, a connection structure 2240 may be formed in accordance with a size of the semiconductor chip 2220 on the semiconductor chip 2220. The connection structure 2240 may be formed by forming an insulating layer 2241 on the semiconductor chip 2220 using an insulation material such as a photoimageable dielectric (PID) insulation material, forming a via hole 2243$h$ opening the connection pads 2222, and forming wiring patterns 2242 and vias 2243. Then, a passivation layer 2250 protecting the connection structure 2240 may be formed, an opening 2251 may be formed, and an underbump metal layer 2260, and the like, may be formed. Thus, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads of the semiconductor chip, such as input/output (I/O) terminals, are disposed inside the semiconductor chip, and may have excellent electrical properties and be produced at a relatively low cost. Therefore, many elements mounted in smartphones have been manufactured in a fan-in semiconductor package form. Specifically, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip of a compact size. In addition, due to the disadvantage as above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals may not be sufficient to directly mount the fan-in electronic component package on the mainboard of the electronic device.

Figure 12:
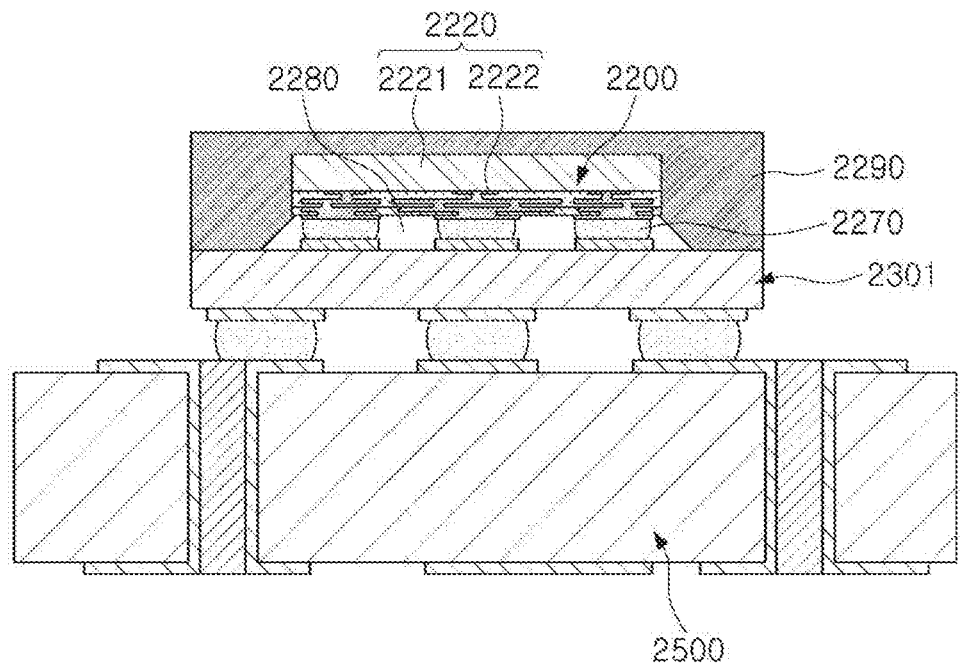
FIG. 12 is a schematic cross-sectional view illustrating a fan-in semiconductor package mounted on an interposer substrate and ultimately mounted on a mainboard of an electronic device.

FIG. 12 is a schematic cross-sectional view illustrating a case in which a fan-in semiconductor package is mounted on an interposer substrate and is ultimately mounted on a mainboard of an electronic device.

Figure 13:
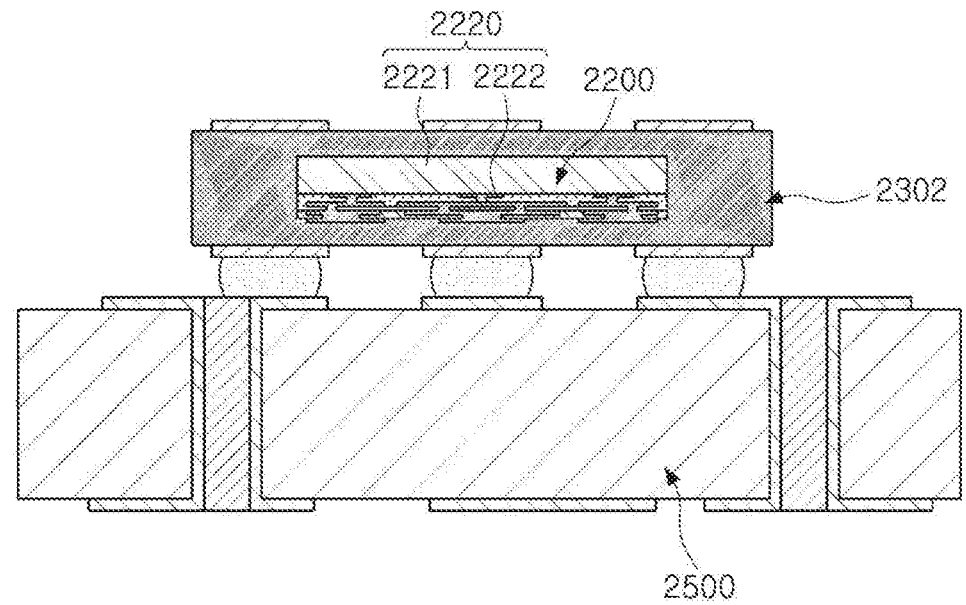
FIG. 13 is a schematic cross-sectional view illustrating a fan-in semiconductor package embedded in an interposer substrate and ultimately mounted on a mainboard of an electronic device.

FIG. 13 is a schematic cross-sectional view illustrating a case in which a fan-in semiconductor package is embedded in an interposer substrate and is ultimately mounted on a mainboard of an electronic device Referring to FIGS. 12 and 13, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which the fan-in semiconductor package 2200 is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Thus, the fan-in semiconductor package may be mounted on the separate interposer substrate and then mounted on the mainboard of the electronic device after going through a packaging process again, or may be mounted and used on the mainboard of the electronic device in a state in which it is embedded in the interposer substrate.

Figure 14:
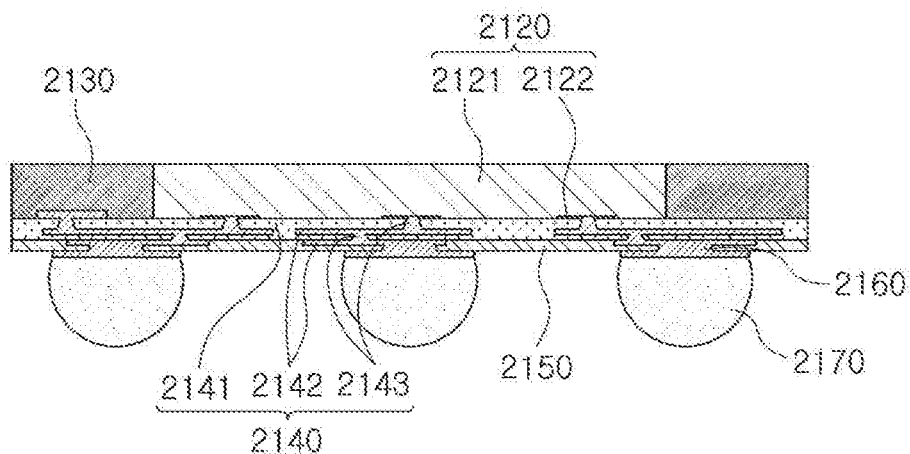
FIG. 14 is a schematic cross-sectional view illustrating a fan-out semiconductor package.

FIG. 14 is a schematic cross-sectional view illustrating a fan-out semiconductor package.

Referring to FIG. 14, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 15:
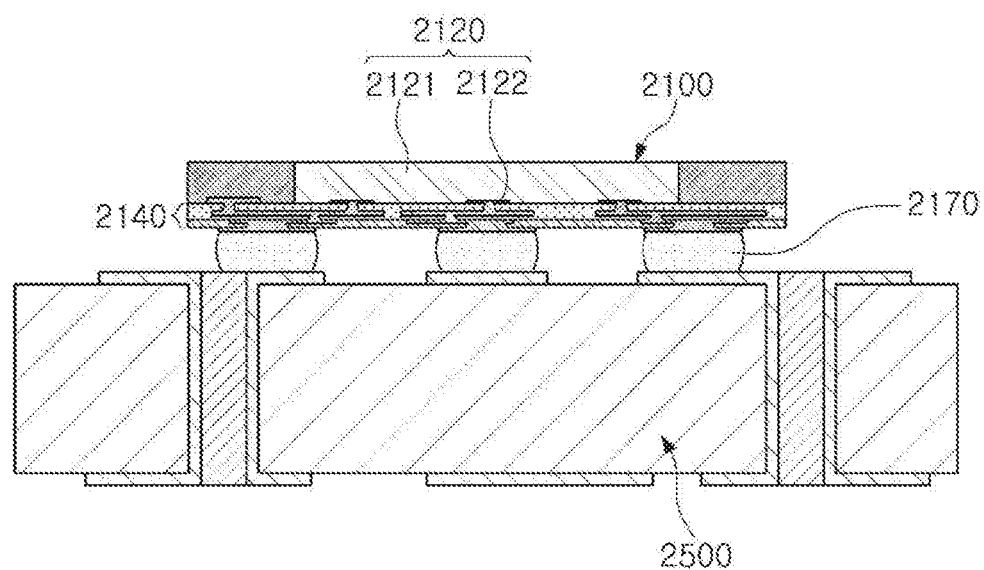
FIG. 15 is a schematic cross-sectional view illustrating a fan-out semiconductor package mounted on a mainboard of an electronic device.

FIG. 15 is a schematic cross-sectional view illustrating a case in which a fan-out semiconductor package is mounted on a mainboard of an electronic device.

Referring to FIG. 15, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

As described above, an apparatus and a method for detecting a wiring short in a substrate according to an embodiment may easily identify a short having a relatively high resistance value and may have a wide short resistance value covering range.

While example embodiments have been shown and described above, it will be apparent to those skilled in the art that modifications and variations could be made without departing from the scope of the present disclosure as defined by the appended claims.

What is claimed is:

1. An apparatus for detecting a wiring short in a substrate, the apparatus comprising:
a voltage source configured to apply a rising or falling measurement voltage to a first wiring of a substrate;

a plurality of electrodes including a first electrode element capacitively coupled to the first wiring, and a second electrode element capacitively coupled to a second wiring of the substrate;

a sensing circuit configured to generate an output voltage based on a voltage or a current between the first electrode element and the second electrode element; and a processor configured to determine whether a short circuit connection having a resistance value greater than a reference resistance value is present between the first wiring and the second wiring, based on a change rate of the output voltage after application of the measurement voltage.

2. The apparatus of claim 1, wherein the sensing circuit is electrically connected to the plurality of electrodes such that the change rate of the output voltage is determined based on a difference between a first time constant, based on first capacitance between the first electrode element and the first wiring, and a second time constant, based on second capacitance between the second electrode element and the second wiring and on resistance between the first and second wirings.

3. The apparatus of claim 1, wherein the processor determines whether the short circuit connection is present based on the change rate of the output voltage when a current of the second electrode element is greater than a current of the first electrode element.

4. The apparatus of claim 1, wherein the processor further determines whether a short circuit connection having a resistance valueless than or equal to the reference resistance value is present between the first wiring and the second wiring, based on a height at which the output voltage rises or falls after application of the measurement voltage.

5. The apparatus of claim 1, wherein the sensing circuit comprises:
an amplifier having an output terminal and first and second input terminals;
a first resistor electrically connected between the first input terminal and the plurality of electrodes;
a second resistor electrically connected between the first input terminal and the output terminal; and
a capacitor electrically connected between the first input terminal and the output terminal.

6. The apparatus of claim 5, wherein the plurality of electrodes further includes a third electrode element capacitively coupled to a third wiring of the substrate,
wherein the voltage source is configured to apply the rising or falling measurement voltage to the third wiring, and the apparatus further comprises a first switch unit having an ON/OFF state controlled such that the measurement voltage is selectively applied to one of the first and third wirings according to a control signal, and
wherein the sensing circuit comprises:
a third resistor electrically connected between the first input terminal and the output terminal; and
a second switch unit electrically connected to at least one of the second and third resistors and having an ON/OFF state controlled according to another control signal.

7. The apparatus of claim 1, wherein the substrate comprises a conductive layer, disposed on a different layer from the first and second wirings, and overlapping the first and second wirings, and wherein the plurality of electrodes is capacitively coupled to the first and second wirings through the conductive layer.

8. A method for detecting a wiring short in a substrate, the method comprising:
capacitively coupling a plurality of electrodes to a first wiring and a second wiring of a substrate;
applying a measurement voltage to the first wiring of the substrate; and
determining whether a short circuit connection having a resistance value greater than a reference resistance value is present between the first wiring and the second wiring, based on a difference between a first time constant of an output signal at the first wiring and a second time constant of an output signal at the second wiring responsive to applying the measurement voltage.

9. The method of claim 8, wherein the determining whether a short circuit connection is present comprises determining the difference between the first time constant, determined based on first capacitance between the plurality of electrodes and the first wiring, and the second time constant, determined based on second capacitance between the plurality of electrodes and the second wiring and on short resistance between the first and second wirings.

10. The method of claim 8, wherein the determining whether a short circuit connection is present comprises integrating a current of the plurality of electrodes when a charging and/or discharging speed depending on the second capacitance is higher than a charging and/or discharging speed depending on the first capacitance, and determining whether the short circuit connection is present based on a value of the integrated current.

11. The method of claim 8, further comprising determining whether a short circuit connection having a resistance value less than or equal to the reference resistance value is present between the first wiring and the second wiring, based on a height at which a voltage of the plurality of electrodes rises or falls.

12. The method of claim 8, wherein the applying a measurement voltage comprises applying the measurement voltage having at least one of a pulse waveform, an impulse waveform, and a step waveform to the first wiring of the substrate.

13. The method of claim 8, further comprising:
disposing a chipset, electrically connected to the first and second wirings, on the substrate when the short circuit connection is determined not to be present between the first and second wirings.

14. A method for detecting a wiring short in a substrate, the method comprising
applying a rising or falling measurement signal to a first wiring from among first and second wirings of a substrate;
concurrently measuring response signals in first and second electrode elements capacitively coupled to the first and second wirings of the substrate, wherein the response signals are responsive to the applied measurement signal; and
determining that a short circuit connection is present between the first and second wirings of the substrate according to a difference in the concurrently measured response signals in the first and second electrode elements.

15. The method of claim 14, wherein the determining that a short circuit connection is present comprises determining that a short circuit connection having a resistance value greater than a reference resistance value is present between the first wiring and the second wiring based on a difference in change rates of the concurrently measured response signals in the first and second electrode elements after application of the measurement signal.

16. The method of claim 15, wherein the determining that a short circuit connection is present comprises determining that a short circuit connection having a resistance value greater than a reference resistance value is present based on a difference between a first time constant, based on first capacitance between the first electrode element and the first wiring, and a second time constant, based on second capacitance between the second electrode element and the second wiring and on resistance between the first and second wirings.

17. The method of claim 14, wherein the determining that a short circuit connection is present comprises integrating a current signal in the first and second electrode elements after application of the measurement signal, and determining that the short circuit is present based on the integrated current signal.

18. The method of claim 14, wherein the determining that a short circuit connection is present comprises determining that a short circuit connection having a resistance value less than or equal to a reference resistance value is present between the first wiring and the second wiring based on a height of a voltage of the first and second electrode elements after application of the measurement signal.

* * * * *